(12) United States Patent
Isfort et al.

(10) Patent No.: US 8,008,233 B2
(45) Date of Patent: Aug. 30, 2011

(54) COATED CONDUCTOR WITH SIMPLIFIED LAYER ARCHITECTURE

(75) Inventors: Dirk Isfort, Heidenheim (DE); Joachim Bock, Erftstadt (DE); Judith Louise Driscoll, Cambridge (GB); Ahmed Kursumovic, Cambridge (GB)

(73) Assignees: Nexans, Paris (FR); Cambridge Enterprise Limited, Cambridge (CA)

( * ) Notice: Subject to any disclaimer, the term of this patent is extended or adjusted under 35 U.S.C. 154(b) by 80 days.

(21) Appl. No.: 12/215,924

(22) Filed: Jun. 30, 2008

(65) Prior Publication Data
US 2009/0105080 A1 Apr. 23, 2009

(30) Foreign Application Priority Data

Jul. 2, 2007 (EP) .................................. 07111557

(51) Int. Cl.
*H01L 39/12* (2006.01)

(52) U.S. Cl. ........ 505/238; 505/236; 505/125; 505/232; 505/230; 505/237; 174/125.1; 174/15.5

(58) Field of Classification Search .................. 505/236, 505/125, 232, 230, 237, 238; 174/125.1, 174/15.5
See application file for complete search history.

(56) References Cited

U.S. PATENT DOCUMENTS

| | | | | |
|---|---|---|---|---|
| 6,399,154 | B1 | 6/2002 | Williams et al. | 427/327 |
| 6,537,689 | B2 * | 3/2003 | Schoop et al. | 428/701 |
| 6,610,632 | B2 * | 8/2003 | Honjo et al. | 505/237 |
| 7,622,425 | B2 * | 11/2009 | Allais et al. | 505/236 |
| 7,737,086 | B2 * | 6/2010 | Allais et al. | 505/238 |
| 7,807,608 | B2 * | 10/2010 | Wolf et al. | 505/238 |
| 2007/0026247 | A1 * | 2/2007 | Paranthaman et al. | 428/469 |
| 2007/0197045 | A1 | 8/2007 | Backer et al. | 438/758 |
| 2008/0039330 | A1 * | 2/2008 | Wolf et al. | 505/100 |

FOREIGN PATENT DOCUMENTS

| | | |
|---|---|---|
| EP | 1178129 | 2/2002 |
| WO | WO 2004015787 A1 * | 2/2004 |

OTHER PUBLICATIONS

Reg. No. 12031-48-0, Nov. 16, 1984.*
Obradors et al., "Progress towards all-chemical superconducting YBa2Cu3O7-coated conductors", Supercond. Sci. Technol. 19 (2006) S13-S26.*
Molina et al., "Chemically deposited La2Zr2O7 buffer layers for YBCO-coated conductors: film growth and microstructure", Supercond. Sci. Technol. 19 (2006) 1200-1208.*
Celik et al., "Numerical analysis of the influence of buffer layer thickness on the residual stresses in YBCO/La2Zr2O7/Ni superconducting materials", Materials and Design 28 (2007) 2184-2189 (available online Sep. 14, 2006).*
Sathyamurthy et al., "Lanthanum zirconate: A single buffer layer processed by solution deposition for coated conductor fabrication", J. Mater. Res. 17 (9) (Sep. 2002), 2181-2184.*
Kursumovic et al., "Hybrid liquid phase epitaxy processes for YBa2Cu3O7 film growth", Supercond. Sci. Technol. 17 (2004) 1215-1223.*
J.L. MacManus-Driscoll et al., "YBa2Cu3O7 Coated Conductor Grown by Hybrid Liquid Phase Epitaxy", IEEE Transactions on Applied Superconductivity, 17(2) (Jun. 2007), 2537-2541.*
European Search Report dated Nov. 26, 2007.

* cited by examiner

*Primary Examiner* — Douglas Mc Ginty
(74) *Attorney, Agent, or Firm* — Sofer & Haroun, LLP

(57) ABSTRACT

A coated conductor with simplified layer architecture includes a biaxial textured substrate, a template buffer layer composed of a material having the general formula $RE_{2-x} B_{2+x} O_7$ with RE being at least one lanthanoid metal, B being at least one metal selected from Zr and Hf and $-0.4 \leq x \leq +0.7$, where the superconductor layer is obtainable by hybrid liquid phase epitaxy and can be deposited directly onto the template buffer layer.

5 Claims, 1 Drawing Sheet

COATED CONDUCTOR WITH SIMPLIFIED LAYER ARCHITECTURE

RELATED APPLICATION

This application claims the benefit of priority from European Patent Application No. 07 111 557.0, filed on Jul. 2, 2007 the entirety of which is incorporated by reference.

FIELD OF THE INVENTION

The present invention relates to a coated conductor with simplified layer architecture.

BACKGROUND

Generally, coated conductors are tape-like conductors having a multilayer composition with a substrate, a superconductor layer and a varying number of buffer layers between the substrate and the superconductor layer. The buffer layers serve to compensate for the various different properties of the material used. Typical coated conductor structures require several buffer layers.

Though not restricted thereto nowadays the rare earth barium cuprate type-superconductors of the formula $REBa_2Cu_3O_7$-x are conventionally used in the production of coated conductors. A particular member thereof is that one known by the reference YBCO-123 wherein the numerical combination 123 stands for the stoichiometric ratio of the elements Y, Ba and Cu.

One major problem in the production of such high-temperature superconductors is the orientation or alignment of the crystal grains of the superconductor material which should be as high as possible in order to have high current carrying properties such as critical current density (Jc) and critical current (Ic) in the super-conducting state. Preferably the superconductor layer has a biaxial texture with the crystal grains being aligned both parallel to the plane of the layer (a-b alignment) and perpendicular to the plane of the layer (c-axis alignment).

The quality of the biaxial texture is typically expressed in terms of the crystallographic in-plane and out-of-plane grain-to-grain misorientation angle. For providing good superconductor performance said angle should be as small as possible. Preferably the angle should not exceed 9° for obtaining superconductor properties sufficient for practical use.

The degree of texture, i.e. the sharpness of the texture, can be determined by X-Ray diffraction specifying the in-plane and out-of-plane orientation distribution function of the grains of the layer.

Based on the X-ray data the values of the full-width-half-maximum (FWHM) of the in-plane phi scan ($\Delta\phi$) and out-of-plane rocking curve ($\Delta\omega$) can be obtained. The smaller the respective FWHM-values the sharper the texture.

Orientation of a layer to be grown can be achieved by epitaxial growth. Epitaxial growth refers to a process wherein the layer to be grown adopts the crystallographic orientation of the substrate or layer onto which the layer is formed.

That is, the crystallographic orientation of the layer grown is directly related to the crystallographic orientation of the underlying layer onto which said layer is deposited.

Consequently, for epitaxial growth a suitably oriented surface must be provided which can serve as template for the desired orientation to the superconductor layer deposited thereon.

According to the simplest approach a single crystal substrate could be used for achieving the desired biaxial texture of the superconductor layer. However, single crystal substrates are generally expensive and have only poor mechanical properties. Further, the surface area is only limited so that large scale production of coated conductors with long lengths as required for practical applications is not possible.

According to the so-called IBAD (ion beam assisted deposition) approach, a highly textured buffer layer is deposited by ion beam assisted deposition on a randomly oriented metallic substrate, said buffer layer serves to transfer the desired texture to the superconductor layer grown onto the buffer layer. IBAD relates to a vacuum deposition technique requiring specific equipment. Further, by such vacuum techniques coating of substrates of long lengths is difficult.

According to yet another approach substrates are used which have been biaxially textured, for example, by mechanical deformation followed by recrystallization annealing. A specific example for such a method is called RABiTs (rolling assisted biaxially textured substrates). On such textured substrates as obtained by RABiTs buffer layers with suitable texture can be deposited, which, in turn, can serve as template for transferring the desired texture to a superconductor layer to be grown on the buffer layer. Examples of metals suitable as substrate are copper, nickel, silver, iron and alloys thereof etc.

However, this approach using biaxially textured substrates has the drawback that intermediate buffer layers are required between the buffer layer serving as template (in the following referred to "template buffer layer" or "template") and the superconductor layer for example for preventing chemical reaction between the substrate material and material of the superconductor layer, for avoiding oxidation of the metal surface of the substrate which is particularly a problem in case of metal substrates, etc. Usually several different buffer layers are required between the template buffer layer and the superconductor layer.

Typical buffer layers are oxides and include cerium oxide, yttrium-stabilized zirconia (YSZ), strontium titanium oxide, rare-earth aluminates and various rare-earth oxides.

For example, a typical RABiTs based YBCO coated conductor has an architecture of $NiW/Y_2O_3/YSZ/CeO_2/YBCO$.

Methods for growing buffer layers for coated conductors are well known to those in the art and include for example, vacuum methods, such as physical vapour deposition (PVD), for example pulsed laser deposition (PLD), electron beam evaporation and sputtering as well as non-vacuum deposition processes such as chemical solution deposition, chemical vapour deposition (CVD) and metal organic chemical vapour deposition (MOCVD).

Apart from the need of several buffer layers the buffer layer serving as template must be of high quality with a close lattice match to the superconductor material to be grown in order ensure the formation of the desired high crystalline orientation of the superconductor layer.

"Close lattice match" requires similar crystal structure of the template and the superconductor layer to be grown thereon with the lattice parameters of the template being close to the lattice parameters of the superconductor layer to be grown thereon in order to allow the desired epitaxial growth of the superconductor layer.

Only if there is sufficient lattice match, transfer of the texture of the template to the superconductor layer to be grown thereon may occur.

However, there is a particular problem, that usually the sharpness of the texture of the obtained layer, here the superconductor layer, is reduced compared to that of the underlying template layer, i.e. the respective FWHM-values are larger. Consequently, for obtaining a sufficiently sharp texture of the superconductor layer template layers are required with a texture as sharp as possible in order to allow compensation of the texture loss in the superconductor layer to be grown thereon.

There are some attempts in the art to reduce the number of buffer layers and to improve lattice match of the buffer layer with the superconductor layer in order to support the transfer of texture. However in none of these documents the loss of texture sharpness of the superconductor layer grown compared to the underlying template layer is addressed.

For example, EP 1 178 129 is related to a YBCO coated conductor obtained by IBAD using a non-oriented substrate wherein the buffer layer serving as template for transferring the desired orientation to the YBCO layer is deposited by ion beam assisted deposition.

It is disclosed that the number of buffer layers in a coated conductor composed of a non-oriented substrate, a first buffer layer made of YSZ, a second buffer layer made of $Y_2O_3$ and a YBCO-superconductor layer can be reduced by replacing the first and the second buffer layer by a buffer layer made of a compound having the general formula $RE_2Zr_2O_7$ or $RE_2Hf_2O_7$ with RE being a rare earth element selected from lanthanum and the lanthanoids. As discussed here the problem with a buffer layer made of YSZ is that during heat treatment, necessary in the formation of the final superconductor layer, diffusion of components of the superconductor layer and the YSZ layer is likely to occur. Such diffusion is prevented by the provision of the $Y_2O_3$ layer.

Due to smaller reactivity of $RE_2Zr_2O_7$ or $RE_2Hf_2O_7$ compared to YSZ provision of an additional layer for avoiding diffusion is no longer necessary.

As a consequence, the number of buffer layers can be reduced. Further, it is disclosed that by suitable selection of the component Re the lattice constants of the resulting buffer layer can be adjusted to those of the superconductor layer to be grown in order to obtain buffer layers having a close lattice match to the superconductor layer.

There is a discussion of the deposition parameters of the buffer layer in order to obtain a reduction of the missorientation angle of said buffer layer.

According to EP 1 178 129 fairly thick buffer layers of 1000 nm are required.

As in EP 1 178 129 U.S. Pat. No. 6,399,154 discloses to replace the conventionally used YSZ buffer layer for transferring orientation to the YBCO layer to be deposited by $RE_2Zr_2O_7$ (REZO) in view of the possibility for adjusting the lattice parameters of the obtained buffer layer as close as possible to the lattice parameters of the YBCO layer as well as of the possibility for reducing the number of layers. Contrary to EP 1 178 129 U.S. Pat. No. 6,399,154 relates to the RABiTs approach using a textured metal substrate, and the template buffer layer is formed by a metal organic deposition technique, such as the sol-gel route.

Though reference is made to direct growth of a YBCO film onto the buffer layer there is no disclosure of the suitability of such directly grown YBCO-layer in coated conductors. Moreover, in the examples in addition to the ReZO layer further buffer layers are used such as YSZ and $CeO_2$. This is consistent with the results of T. G. Chirayil et al, "Epitaxial growth of $La_2Zr_2O_7$ thin films on rolled Ni-substrates by sol-gel process for high Tc superconducting tapes" in Physica C336 (2000) 63-69. As stated herein attempts to deposit YBCO (300 nm) directly on a sol-gel processed LZO buffer layer of 60 nm thickness results in YBCO films with decreased critical temperature. The reason therefore is seen in the presence of nickel oxide suggesting Ni diffusion from the substrate into the buffer layer.

S. Sathyamurthy et al., Lanthanum zirconate: A buffer layer processed by solution deposition for coated conductor fabrication, in J. Mater. Res., Vol. 17, No. 9, September 2002, pages 2181 to 2184 relates to the replacement of the conventionally used multilayer buffer architecture by only a single buffer layer which can be deposited using a scalable technique.

Reported are the results of using a single lanthanum zirconate $La_2Zr_2O_7$ buffer layer deposited by sol-gel processing for YBCO coated conductor, the YBCO layer being deposited by pulsed laser deposition (PLD).

As substrates textured Ni and Ni—W tapes, respectively, are used.

WO 2006/015819 A1 relates to a "all solution process" wherein the buffer layers as well as the superconducting layer are deposited by means of chemical solution deposition. It was the object to avoid conventionally used physical processes such as pulsed laser deposition (PLD) for depositing superconducting layers.

WO 2006/015819 A1 gives no explanation as to any particular deposition method for the YBCO layer. However, as far as reference to the deposition of the YBCO layer is made it is pointed to the "all solution process", which is a clear indication, that also the YBCO layer is obtained by chemical solution deposition.

In J. L. Mac Manus-Driscoll et al., $YBa_2Cu_3O_7$ Coated Conductor Grown by Hybrid Liquid Phase Epitaxy, in IEEE Transactions on Applied Superconductivity, Vol. 17, No. 2, June 2007, pages 2537 to 2541 and A. Kursumovic et al., Hybrid liquid phase epitaxy processes for $YBa_2Cu_3O_7$ film growth, in Superconductor Science and Technology, 17 (2004), pages 1215 to 1223 coated conductors are discussed using a single crystal substrate on one side and a biaxially textured Ni-substrate made by RABiTS on the other side.

The HLPE-process discussed requires the provision of a liquid BaO—CuO flux layer.

With respect to the results obtained for the Ni substrate made by RABiTS technique it is stated, that growth in the optimal regime was hampered by excessive flux attack. To this, it is stated that "substrate/buffer dissolution can occur . . . ".

Buffer dissolution, however, would affect the texture quality and, thus, the suitability of the buffer layer for transferring biaxial texture to the YBCO layer to be grown.

OBJECTS AND SUMMARY

The present invention relates to the RABiTs approach using biaxially textured substrates.

It was the object of the present invention to provide a coated conductor with simplified layer architecture wherein the superconductor layer can be directly deposited onto the template buffer layer. In particular, it was the object of the present invention to provide a coated conductor requiring only one buffer layer.

Further, it was the object of the present invention to provide a coated conductor with simplified layer architecture wherein the texture of the grown superconductor layer is sharper than that of the underlying template buffer layer. Since the texture of the superconductor layer can be sharper compared to the texture of the template buffer layer according to the present invention, it is possible to grow suitable biaxially textured superconductor layers even on buffer layers of moderate quality.

According to yet an other object of the present invention a coated conductor is provided having a thick superconductor layer of 500 nm or more, in particular of 800 nm and more in thickness, having good biaxial texture over the whole thickness of the superconductor layer.

In addition, it was the object of the present invention to provide a method for obtaining such thick superconductor layer within an economically reasonable short time.

According to the present invention a coated conductor is provided comprising
a biaxially textured substrate,
a buffer layer composed of a material having the general formula $RE_{2-x}B_{2+x}O_7$, with RE being at least one metal selected from La, Ce, Pr, Nd, Pm, Sm, Eu, Gd, Tb, Dy, Ho, Er, Y, Tm, Yb and Lu, B being at least one metal selected from Zr and Hf and $-0.4 \leq x \leq 0.7$
and a superconductor layer directly deposited onto the buffer layer, wherein the superconductor layer is obtainable by hybrid liquid phase epitaxy.

Further, the present invention is directed to the use of a buffer layer having the general formula $RE_{2-x}B_{2+x}O_7$ as defined above in a coated conductor comprising a biaxially textured metal substrate and a superconductor layer obtainable by hybrid liquid phase epitaxy.

The present invention is also directed to a method for producing the coated conductor of the present invention, said coated conductor comprising a biaxially textured substrate and a buffer layer composed of a material having the general formula $RE_{2-x}B_{2x}O_7$ as defined above, wherein a superconductor layer is directly deposited onto the buffer layer by hybrid liquid phase epitaxy.

According to the present invention with the specific buffer layer of the general formula as set out above and the superconductor layer being deposited by hybrid liquid phase epitaxy, coated conductors can be obtained with biaxially textured substrates wherein the superconductor layer can be deposited directly onto the buffer layer without the need of additional intermediate buffer layer(s). Thus, significant simplification of the conventionally used layer architecture of such coated conductors produced on such substrates is achievable.

In addition since the texture of the grown superconductor layer can be sharper than that of the template buffer layer the requirements to the buffer layer quality are less restrictive which also contributes to the economical efficiency.

Moreover according to the present invention superconductor layers with a thickness of 500 nm or more, in particular 800 nm and more are obtainable with good texture quality over the whole thickness of the superconductor layer. An YBCO layer deposited by hybrid liquid phase epitaxy is clearly distinguished in microstructure from YBCO layers deposited by other methods such as by metal organic disposition such as sol-gel process, or other physical and chemical deposition methods such as pulsed laser deposition etc.

A further advantage of the present invention is that the buffer layer can be deposited by metal organic deposition (MOD) process which is a non-vacuum process and which is cheaper and easier to handle than a vacuum process, and allows simple coating of long and/or irregularly shaped substrates.

In principle, for the present invention any substrate with suitable biaxial texture can be used.

Specific examples for suitable substrates are the biaxially textured metal substrates as obtainable by RABiTS. Examples for suitable metals are Cu, Ni, Ag or alloys based on these metals such as Ni-based-alloys with at least one alloying component selected from W, Mo etc.

Suitable metals and processes for texturing these metals to be usable as a substrate for a coated conductor are well known in the art.

The template of the present invention is made of a material of $RE_2B_2O_7$-type with RE being at least one selected from La, Ce, Pr, Nd, Pm, Sm, Eu, Gd, Tb, Dy, Ho, Er, Y, Tm, Yb and Lu and B being at least one selected from Zr and Hf.

By variation of Re and B adjustment of the lattice parameters is possible in order to obtain close lattice match to the superconductor layer to be grown due to the different atomic sizes of the atoms.

For example, in view of lattice match for the growth of YBCO superconductors a buffer layer of $La_2Zr_2O_7$ (LZO) has been proven to be particularly useful.

According to the present invention further adjustment is possible by stoichiometric variation of the proportion of RE and B present in the buffer material with the ratio of RE:B being in a range of from 0.75 to 1.90.

That is, according to the present invention the material of the template can have a chemical formula $RE_{2-x}B_{2+x}O_7$ with $-0.4 \leq x \leq +0.7$, preferably with $-0.3 \leq x \leq 0.3$.

In this case the influence of the variation of x on the lattice parameters depends on the size difference of the RE-atoms and B-atoms.

The smaller the difference in the sizes of RE-atoms and B-atoms, the less is the influence of the proportional variation of A-atoms and B-atoms on the lattice parameters.

Thus, for achieving a large effect, atoms RE and B should be selected to have a large atomic size difference.

The atomic size of the RE-atoms is of from 0.95 Å (Angstrom) to 1.2 Å, and that of the B-atoms varies from 0.6 Å to 0.8 Å.

Typically the atomic size ratio RE:B should be within a range of 0.75 to 1.90. A particularly preferred example for a suitable combination of RE- and B-atoms (RE; B) is La/Zr.

Preferably, the material used for the template should crystallize in the cubic crystal system. More preferably, the material should show a structure such as of pyrochlore, fluoride, monoclinic type etc.

According to the present invention "monoclinic type structure" refers to a lattice which is different from the cubic system in having only two equal axes with the third axis being different.

A combination of RE-atoms and B-atoms which has an extended phase field for the cubic phase in the RE-B-O phase diagram can be particularly useful since the larger the phase field of a suitable phase within the phase diagram, the more the variation possibilities of the proportion of RE and B by variation of x without precipitating other phases.

For the present invention, there is no particular restriction as to the deposition method of the buffer layer of the present invention. For example any of methods referred to above can be used.

However, in view of costs, non-vacuum techniques, e.g. chemical solution processes, are preferred. By such techniques long length coated conductors can be obtained easily and with reasonable costs in a lengths as required for cable and wire applications.

According to a preferred embodiment of the present invention deposition of the buffer layer onto the substrate can be done by metal organic deposition/decomposition (MOD).

According to the MOD techniques, a layer such as the present buffer layer of formula $RE_{2-x}B_{2+x}O_7$ can be produced by deposition of film forming metal-organic compounds from a solution on a substrate. Hereby a stoichiometric mixture of suitable precursor compounds for RE and B in an organic solvent can be used. The obtained fresh films are further dried, pyrolysed (organic burn out) usually at temperatures between 200° C. and 500° C. Subsequently, crystallisation is carried out wherein a temperature not exceeding half of the melting temperature of the desired final oxide film has been shown to be particularly useful. The growth process of the oxide film is a solid state growth process, comparable to crystallisation in amorphous glasses.

Depending on the precursor materials used and/or solvents etc. there are different techniques in the metal organic deposition such as the sol-gel technique, in particular the trifluoroacetate (TFA) route using the metal trifluoroacetates as precursors.

MOD for the preparation of metal oxide films is generally known to those in the art and there exist numerous publications dealing with MOD and the different modifications thereof such as sol-gel and trifluoroacetate routes.

In addition, layers obtained by MOD such as by sol-gel technique can be easily identified and distinguished from layers obtained by other techniques such as by vacuum techniques in view of micro structure such as for example grain size, porosity, defects and density by using, for example, transmission electron microscopy (TEM) which is standard for coated conductors.

For the present invention as superconductor material, in principle, any oxide superconductor can be used such as the rare earth-barium-cuprate-type superconductors, the bismuth-strontium-calcium-cuprate-type superconductors known by the reference BSCCO-2212 and BSCCO-2223 or one of thalium- and -mercury based superconductors, respectively, for example, thalium-strontium-calcium-barium-cuprate-type superconductors and mercury-barium-strontium-calcium-cuprate-type superconductors.

A preferred superconductor material is REBCO-123 RE being rare earth metal, in particular YBCO-123.

For superconductor layer of high performance in addition to a high critical current density Jc high critical current Ic is desirable. The critical current Ic depends on the layer thickness and, thus, for high critical current sufficiently thick superconductor layers are advantageous.

A problem of the known methods is that with increasing layer thickness the texture tends to become deteriorated toward the surface region, so that Ic of thick superconductor layers increases slower than an increase in thickness.

To the contrary, according to the present invention well textured superconductor layers can be obtained in a thickness of 1000 nm or more and 2000 nm or more and up to about 4000 nm. That is, according to the present invention Jc remains high even for comparatively thick superconductor films, leading to Ic increasing almost linearly with increasing thickness.

Further, according to the present invention typically a thickness of the buffer layer of about 50 nm to about 200 nm can be used. Thus, comparatively thin buffer layers are sufficient which is also advantageous in view of process economy.

By the present invention it has been surprisingly found that by combination of HLPE and the buffer layer of the present invention with general formula $RE_{2-x}B_{2+x}O_7$ the superconductor layer can be directly deposited onto the buffer layer. By the specific combination of deposition by HLPE and buffer layer material a superconductor layer is obtained which is well oriented and has good superconducting properties, making possible to obtain the advantages referred to above.

HLPE is a variation of the well-known liquid phase epitaxy (LPE).

LPE is a growth method for films or bulk single crystals wherein a substrate is pulled through a liquid phase of the constituent elements of the films or crystals to be grown and epitaxial growth takes place starting from the substrate where nucleation is energetically favoured. There is the problem that processing temperatures are high. Further, the liquid phase which is typically present in a huge amount is very reactive so that it is difficult to find a suitable substrate material which is sufficiently inert to withstand these reaction conditions.

Moreover there is the drawback that usually single crystal substrates are required for obtaining high quality layers with the desired crystal structure.

HLPE is similar to LPE growth, however, requiring significantly lower processing temperatures and, further, only a thin liquid phase layer is required. Consequently the reactivity of liquid phase material with substrate material is reduced. A further advantage of HLPE over LPE is the higher tolerance as to the substrate so that deposition of well oriented layers can be carried out on substrates other than single crystal substrates.

A detailed description of the principles of growing superconductor layers such as YBCO-123 layers by hybrid liquid phase epitaxy is given in Kursumovic A. et al, "Hybrid liquid phase epitaxy processes for $YBa_2Cu_3O_7$ film growth" Supercond. Sci. Technol. 17 (2004) 1215-1223 to which explicit reference is made, in particular with respect to the process details.

Generally, in HLPE growth a flux layer is deposited onto the substrate/buffer layer e.g. by PLD or electron beam evaporation before deposition of the superconductor material starts. The thickness of the flux layer can range from 100 nm to 1000 nm. Similar to LPE the flux layer has a composition suitable for the formation of the layer to be grown. For example in case of REBCO the flux layer can have a composition of Ba:Cu in a ratio from 3:5 to 3:9, preferably 3:5 to 3:7. For a buffered metallic substrate the ratio should be preferably closer to 3:7 since this allows processing at a temperature as low as 800-820° C.

Prior to the deposition of the flux layer a thin seed layer of the superconductor material to be deposited via HLPE can be applied onto the substrate. The seed layer can be deposited by electron beam deposition or any other suitable deposition method. Though there is no specific restriction as to the thickness of the seed layer, the thickness can be typically up to 50 nm.

However the thicker the seed layer the better its protective effect in case there would be any dissolution of the buffer by the flux.

According to need, the seed layer can be also tailored to serve as a unique template e.g. by depositing at different temperatures and/or different p ($O_2$).

The substrate with the deposited flux layer is then heated to the melting point of the flux and is maintained at this temperature while feeding it with essentially stoichiometric superconductor material. "Essentially stoichiometric" means that there is some tolerance in stoichiometrical composition of the feeding.

The feeding of the superconductor material can be done by any method delivering the superconductor material in vapour or nano-particle form such as pulsed laser deposition (PLD) or electron beam evaporation from a target composed of the superconductor material. A layer of the superconductor material is then grown at the substrate/buffer-liquid interface, with the composition of the molten flux layer on top remaining unchanged.

Preferably, the flux can be initially supersaturated with RE component. Said RE component can be the same as that of the superconductor layer to be grown (e.g. Y in case of YBCO) or can be an other thermodynamically stable one, i.e. which has a peritectic temperature below the superconductor growing temperature.

Consequently, if deposition takes place at the growth temperature of the superconductor layer, REBCO starts nucleating as soon as the flux supersaturated with RE gets deposited (in situ). Alternatively, if deposition takes place at a temperature below the melting temperature of the flux, e.g. at room temperature, nucleation starts immediately upon melting of the flux layer (ex situ).

Since in these cases nucleation and growth of the high temperature superconductor layer starts immediately the substrate/buffer or the seed is protected from the molten flux due to the minimized exposure time. Additionally a higher supersaturation can be achieved for REBCO nucleation in the case when the seed layer is absent. The deposition rate of the supersaturated flux layer is virtually unlimited/unrestricted when it is processed above its melting temperature.

The flux layer has the only function to transport the feeded superconductor material from the air-liquid interface to the liquid-growing superconductor layer interface and to enable growth of the superconductor layer from the liquid.

As the liquid flux is highly supersaturated with the superconductor material in terms of RE a very fast growth is obtainable. This means that the liquid flux contains an excess of superconductor material over the equilibrium concentration which drives rapid nucleation and growth. For example, growth rates up to 20 nm/sec and more can be obtained which is more than 20 times faster than obtained with common LPE or PVD growth methods.

BRIEF DESCRIPTION OF THE DRAWINGS

In the following a preferred embodiment of the present invention is described with reference to the accompanying figures for a more detailed illustration of the present invention. However, the principles of the present invention are generally applicable without being restricted to the specific embodiment.

It is shown in FIG. 1 schematically the principle of growth of a superconductor layer by HLPE.

DETAILED DESCRIPTION

The principles of the present invention are explained in more detail referring to a concrete example related to a coated conductor with YBCO-123 superconductor deposited onto a buffer layer of $La_2Zr_2O_7$ (LZO).

According to this example a buffer layer composed of $La_2Zr_2O_7$ is deposited onto a biaxially textured NiW-substrate by metal organic deposition.

For coating the substrate a solution of the acetylacetonates of La and Zr, respectively, solved in propionic acid in a ratio La:Zr=0.95 with a concentration of 0.5 mol La was used. The substrate was dipped into said solution and drawn with 8 m/h. The substrate with the fresh coating was heated to 1000° C. with 2000° C./h, held for one hour at 1000° C. and subsequently cooled to room temperature with 2000° C./h wherein the overall heating process was carried out in flowing $Ar/H_2$ atmosphere.

Then on the buffer layer a 50 nm thick YBCO seed layer is deposited by PLD or other appropriate technique. When the seed is deposited by PLD the deposition temperature can be the same as the final REBCO growth temperature with an optimum in the range of 800° C.-840° C. Deposition is carried out at an oxygen partial pressure for the seed layer ranging from 10 to 100 Pa, and a deposition rate of about ⅕ of the final REBCO film growth rate.

On the seed layer the flux layer composed of 3(BaO)-7 (CuO) and supersaturated with 10 mol % YBCO is deposited by PLD/flame spray (in-situ) or by a screen-printing/cold spray (ex-situ) type technique, with a thickness of 50-500 nm.

The in-situ deposition is carried out under a partial oxygen pressure of >100 Pa and at temperatures around 800° C.-820° C. There is no obvious kinetic limit for the rate of flux deposition since its only requirement is to be molten (or semi-molten) at REBCO growth temperature.

The ex-situ process involves heating the flux to the REBCO growth temperature under the same conditions as for in-situ process.

As soon as the flux is molten (or semi-molten) YBCO feeding is started using PLD. The heating is done in a semi-hot-wall type heating assembly, meaning that the substrate is heated by radiation. The feeding is done from one side of the open heater. A two sided deposition is also possible but with a different heater design.

Figure 1:
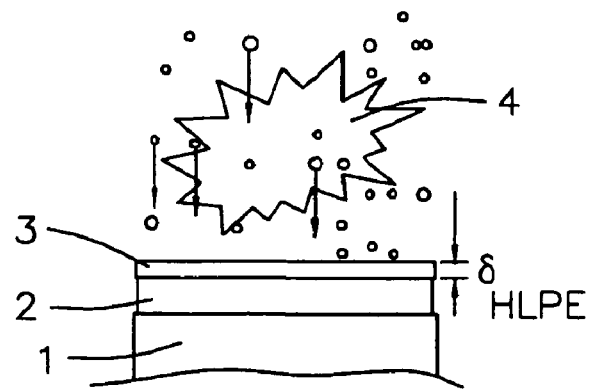

The HLPE growth is schematically shown in FIG. 1, with reference number 1 being the substrate/buffer layer, 2 the growing superconductor layer, 3 the liquid flux layer with thickness δ and 4 source of RE-feeding.

The flux is fed from a Y-source 4 via YBCO atoms, clusters or nano-powders also schematically shown in FIG. 1.

Figure 2:
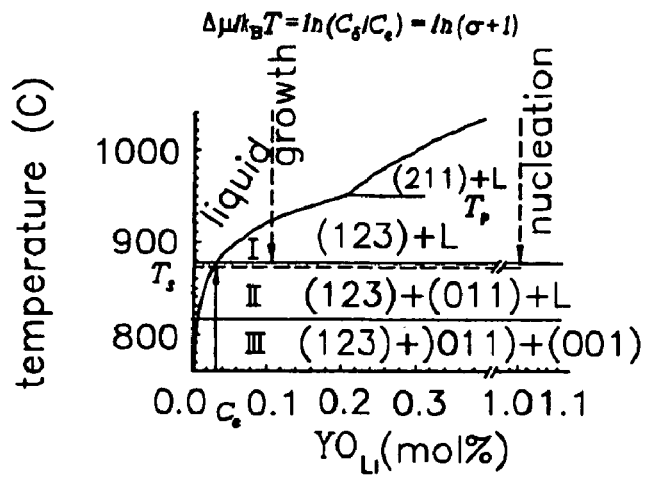
in FIG. 2 the phase diagram of the growth of the YBCO layer according to the example of the present invention; and in FIG. 3 a graph showing a standard X-ray θ-2θ scan (theta-2 theta) of the coated conductor according to the example of the present invention.

The phase diagram of the growth of the YBCO layer of the embodiment is shown in FIG. 2. In the phase diagram Y and $Y_2O_3$, respectively, are referred to in terms of $YO_{1.5}$.

FIG. 2 shows a section through the phase diagram from YBCO to $YO_{1.5}$. The thermodynamic driving force is given by $\Delta\mu/k_B T$ and is in the range 2 to 4 depending on the deposition temperature T (referred to Ts in FIG. 2), where $\Delta\mu$ is the change in chemical potential and $k_B$ is the Boltzmann constant. Here, the measure of supersaturation $\Delta\mu/k_B T$ is defined by $\Delta\mu/k_B T = \ln(C_\delta/C_e)$, where $C_e$ and $C_\delta$ are respectively the equilibrium concentration and actual concentration of $YO_{1.5}$ in the flux at the growth temperature.

According to this embodiment YBCO growth starts from the thin YBCO seed layer and continues with a growth rate of more than 20 nm/sec. A final YBCO layer is grown up to a thickness of 2.000 nm.

Figure 3:
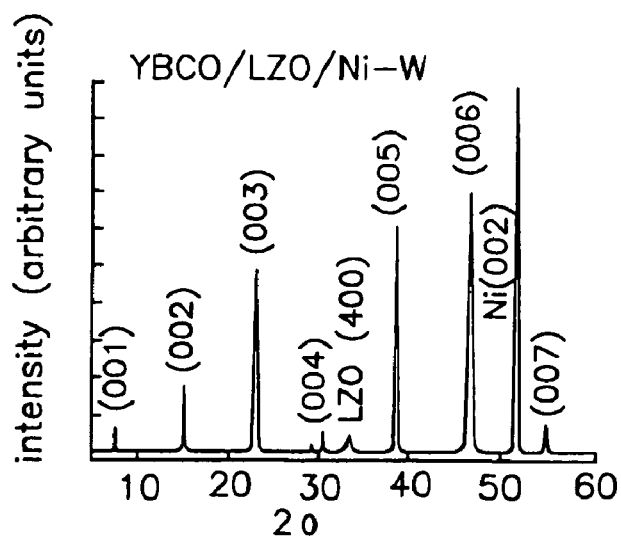

An X-ray diagram of the obtained coated conductor is shown in FIG. 3, and the texture characteristics deduced from measurements of ω (rocking curves) and φ scans are summarized in Table 1.

Texture characteristics of NiW substrate, LZO buffer layer, and YBCO layer in obtained coated conductors[a]

TABLE 1

| Δω$_{TD}$ | | | Δφ | | |
|---|---|---|---|---|---|
| NiW | LZO | YBCO | NiW | LZO | YBCO |
| 5.8 | 6.8 | 1.4 | 6.3 | 7.3 | 5.5 |

[a]Δω$_{TD}$ stands for the full width at half maximum (FWHM) of the 006 rocking curves the axis parallel to the transverse direction of the tape; Δφ stands for average FWHM of four peaks in the ω scans of 111 NiW, 222 LZO and 102(103) YBCO.

The X-Ray data have been obtained using a Siemens D5000 diffractometer with four circle Eulerian cradle allowing measurement of phi scan, rocking curve and pole figure.

Thus, by the present invention it is possible to directly deposit a superconductor layer on the buffer layer of the present invention with better sharpness and a high thickness with a high growth rate.

Furthermore the coated conductor of the present invention shows high Ic even for comparatively thick superconductor layers.

The invention claimed is:

1. Coated conductor comprising:
a biaxially textured substrate;
a template buffer layer composed of a material having the general formula $RE_{2-x}B_{2+x}O_7$ with RE being at least one metal selected from La, Ce, Pr, Nd, Pm, Sm, Eu, Gd, Tb, Dy, Ho, Er, Y, Tm, Yb, and Lu, with B being at least one metal selected from Zr and Hf and $-0.4 \leq x \leq +0.7$, wherein the template buffer layer is deposited on said biaxially textured substrate by metal organic deposition and has a thickness of substantially between 50 nm to 200 nm; and
a superconductor layer containing YBCO-123 that is directly deposited onto the template buffer layer, wherein the superconductor layer is obtained by hybrid liquid phase epitaxy.

2. Coated conductor according to claim 1, wherein at least one of the values for the full width at half maximum of the $\omega$ rocking curve and the $\phi$ scan of the YBCO layer is less than the respective value for the buffer layer.

3. Coated conductor according to claim 1, wherein the superconductor layer has a thickness of at least 800 nm, preferably at least 1000 nm.

4. Coated conductor according to claim 1, wherein B is Zr.

5. Coated conductor according to claim 4, wherein $RE_{2-x}B_{2+x}O_7$ is $La_2Zr_2O_7$.

* * * * *